US006472935B2

(12) United States Patent
King et al.

(10) Patent No.: US 6,472,935 B2
(45) Date of Patent: *Oct. 29, 2002

(54) COMBINING NETWORKS FOR SWITCHABLE PATH POWER AMPLIFIERS

(75) Inventors: Joel R. King, Hillsboro, OR (US); Gordon A. Olsen, Tigard, OR (US); Prasad Yenigalla, San Jose, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 65 days.

This patent is subject to a terminal disclaimer.

(21) Appl. No.: 09/754,409

(22) Filed: Jan. 4, 2001

(65) Prior Publication Data

US 2002/0021169 A1 Feb. 21, 2002

Related U.S. Application Data

(63) Continuation-in-part of application No. 09/692,408, filed on Oct. 19, 2000, now Pat. No. 6,359,514, and a continuation-in-part of application No. 09/048,935, filed on Mar. 26, 1998, now Pat. No. 6,181,208.

(51) Int. Cl.[7] .................................................. H03F 1/14
(52) U.S. Cl. ...................... 330/51; 330/295; 330/124 R; 333/101; 333/103; 333/104
(58) Field of Search ...................... 330/51, 295, 124 R; 333/101, 103, 104

(56) References Cited

U.S. PATENT DOCUMENTS

| 3,449,685 | A | * | 6/1969 | Holmes | 330/295 |
| 5,175,871 | A | * | 12/1992 | Kunkel | |
| 5,287,543 | A | * | 2/1994 | Wolkstein | 330/124 R |
| 5,438,684 | A | * | 8/1995 | Schwent et al. | 330/124 R |
| 5,530,923 | A | * | 6/1996 | Heinona et al. | 330/295 |
| 5,712,593 | A | * | 1/1998 | Buer et al. | |
| 6,181,208 | B1 | * | 1/2001 | King et al. | 330/295 |

* cited by examiner

Primary Examiner—Michael B Shingleton
(74) Attorney, Agent, or Firm—Perkins Coie LLP

(57) ABSTRACT

The present invention teaches a power amplifier having two or more output power devices and a combining network for switching the output path between these several power devices. The first output power device is designed for power efficient signal amplification at the power amplifier's highest output power level. The second output power device is designed for power efficient signal amplification at the output power level that the power amplifier is most likely to operate. Either the first or second output power device is enabled depending on the output power level. A combining network is used to transform the output impedance, as required, for the proper operation of the enabled power device. By switching between a range of power devices according to the output power level, a high level of power efficiency can be achieved across a broad range of operating states of the power amplifier.

28 Claims, 9 Drawing Sheets

COMBINING NETWORKS FOR SWITCHABLE PATH POWER AMPLIFIERS

CROSS REFERENCE TO RELATED APPLICATIONS

This Application is a continuation-in-part of and claims priority to co-pending application Ser. No. 09/692,408 filed Oct. 19, 2000, now U.S. Pat. No. 6,359,514 and a continuation-in-part of Ser. No. 09/048,935 filed Mar. 26, 1998, now U.S. Pat. No. 6,181,208.

TECHNICAL FIELD

The present invention is related to power amplifiers such as those used in cellular communications systems. More specifically, the present invention teaches a power amplifier having at least two output power devices and a mechanism for switching the output path between these two power devices. The first output power device is designed for power efficient signal amplification at the power amplifier's highest output power level. The second output power device is designed for power efficient signal amplification at the output power level that the power amplifier is most likely to operate. By switching between the two power devices according to the output power level, a high level of efficiency can be achieved across a broad range of operating states of the power amplifier.

BACKGROUND ART

The power efficiency of an amplification device such as a transistor varies with operating conditions. For example, a power amplifier designed for power efficiency at one supply voltage may well be inefficient at another supply voltage. However, applications abound that require the power amplifier to operate under varying conditions (e.g., different supply voltages) yet would benefit greatly from power efficient operation. In fact, while there are a variety of design constraints that may be imposed upon any power amplifier application, power efficiency is almost invariably a fundamental design objective.

By way of example, in most communication systems it is preferred that the power amplifier operate efficiently yet maintain acceptable linearity over the desired supply voltage range. To that end, the typical power amplifier is adjusted to achieve peak efficiency at a single output power level and supply voltage. In general, to operate at peak efficiency requires that the voltage swing at the output of the power amplifier be as large as possible. But, improving efficiency by increasing the voltage swing tends to reduce the linearity of the power amplifier. There is therefore, a tradeoff between power efficiency and linearity, with improvements in one coming at the expense of the other.

Many cellular communication systems, such as the CDMA cellular system, require that the power amplifier deliver a wide range of output powers. For more details regarding CDMA cellular systems, please see the Electronic Industry Association's publication EIA/TIA IS-95, which is incorporated herein by reference in its entirety. As will be appreciated, the power amplifier must safely operate at its highest power level. Being designed for the highest power level, a single power amplifier tends to operate less efficiently at lower, more commonly used, power levels. Hence the life of a battery-operated device is shortened because efficient power amplification is unavailable at the more commonly used power levels since a single power amplifier must be designed for the highest power level.

Communication systems such as CDMA cellular systems merely illustrate one example of the multiplicity of power amplifier applications that require operation at numerous operating states. In order to address the shortcomings of the prior art, what is needed is a power amplifier that can achieve high power efficiency at several operating states.

SUMMARY OF THE INVENTION

In order to achieve the foregoing and in accordance with the present invention, a variety of power amplifiers having at least two output power devices and a mechanism for switching the output path between these two power devices are taught herein. The first output power device is designed for power efficient signal amplification at the power amplifier's highest output power level, therefore the first power device may be described as a high power amplifier (HPA). The second output power device is designed for power efficient signal amplification at the output power level that the power amplifier is most likely to operate, therefore the second power device may be described as a low power amplifier (LPA). By switching between the two power devices according to the output power level, a high level of efficiency can be achieved across a broad range of operating states of the power amplifier.

A first embodiment of the present invention teaches a switchable path power amplifier suitable for amplifying an input signal received at a power amplifier input in order to generate an output signal at a power amplifier output. The switchable path power amplifier has first and second power devices, the first substantially optimized for power efficient signal amplification at the first output power level, and the second substantially optimized for power efficient signal amplification at the second output power level. The switchable path power amplifier also includes state determination circuitry arranged to determine the power level at which the switchable path power amplifier is operating, and a combining network arranged to decouple a disabled power device from an output load coupled to the switchable path power amplifier, such that any effect of the disabled power device upon an amplified electrical signal generated by the enabled power device is negligible. The state determination circuitry is further operable to a) enable the first power device and disable the second power device when the switchable path power amplifier is operating at the first output power level and b) enable the second power device and disable the first power device when the switchable path power amplifier is operating at the second output power level.

The first power device is intended for amplifying the input signal during a first operating state of the switchable path power amplifier and includes a first power device input coupled to the power amplifier input and a first power device output. The second power device is intended for amplifying the input signal during a second operating state of the switchable path power amplifier and includes a second power device input coupled to the power amplifier input and a second power device output. The combining network device includes first and second combining network device inputs coupled to the first and second power device outputs, respectively, and a combining network device output coupled to the power amplifier output. The combining network device is operable to select between the first and second power devices such that only one of the power devices drives the power amplifier output.

One embodiment of the combining network device transforms the power amplifier output impedance into the output impedance required for the proper operation of the enabled power device through the use of dual matching network devices. Each power device, both the LPA and HPA, is connected to the power amplifier output through parallel matching network devices, which transform the output impedance at the power amplifier output into the proper output impedance for the operation of the enabled power device.

Another embodiment of the combining network device further protects the performance of the LPA by modifying the parallel connection thereby reducing the effect of the HPA on LPA performance. The first matching network device transforms the output impedance into an output impedance preferred by the HPA which is then passed through both a switch and the second matching network device to ensure the LPA sees the correct output impedance at the power amplifier output for proper operation. In this embodiment, the overall efficiency is thereby improved due to the reduced effect of the HPA on the overall implementation.

Another related embodiment of the present invention contemplates a switchable path power amplifier having three or more power devices (i.e. a low power amplifier LPA, an intermediate power amplifier IPA and a high power amplifier HPA). In this embodiment, each of the three or more power devices would be suitably designed for a particular operating state (e.g., output power level). The state determination circuitry would therefore operate to enable the appropriate power device, and simultaneously disable the other power devices.

Yet another embodiment of the present invention teaches a switchable path power amplifier suitable for use in an RF communications system. The RF communication system has first and second output power levels, the first corresponds to the highest output power required of the RF communications system and the second corresponds to the output power at which the RF communications system most typically operates.

Another aspect of the present invention teaches a method for amplifying an electrical signal over multiple power levels, the amplified electrical signal driving an output load. The method begins by providing a switchable path power amplifier having first and second power devices, the first power device intended for amplifying the electrical signal during a first power level, and the second power device intended for amplifying the electrical signal during a second power level. The method then determines the power level of the switchable path power amplifier, and when the power level is at the first power level, selects the first power device for use in amplifying the electrical signal. However, when the power level is at the second power level, the method selects the second power device for use in amplifying the electrical signal.

BEST MODES FOR CARRYING OUT THE INVENTION

Figure 1:
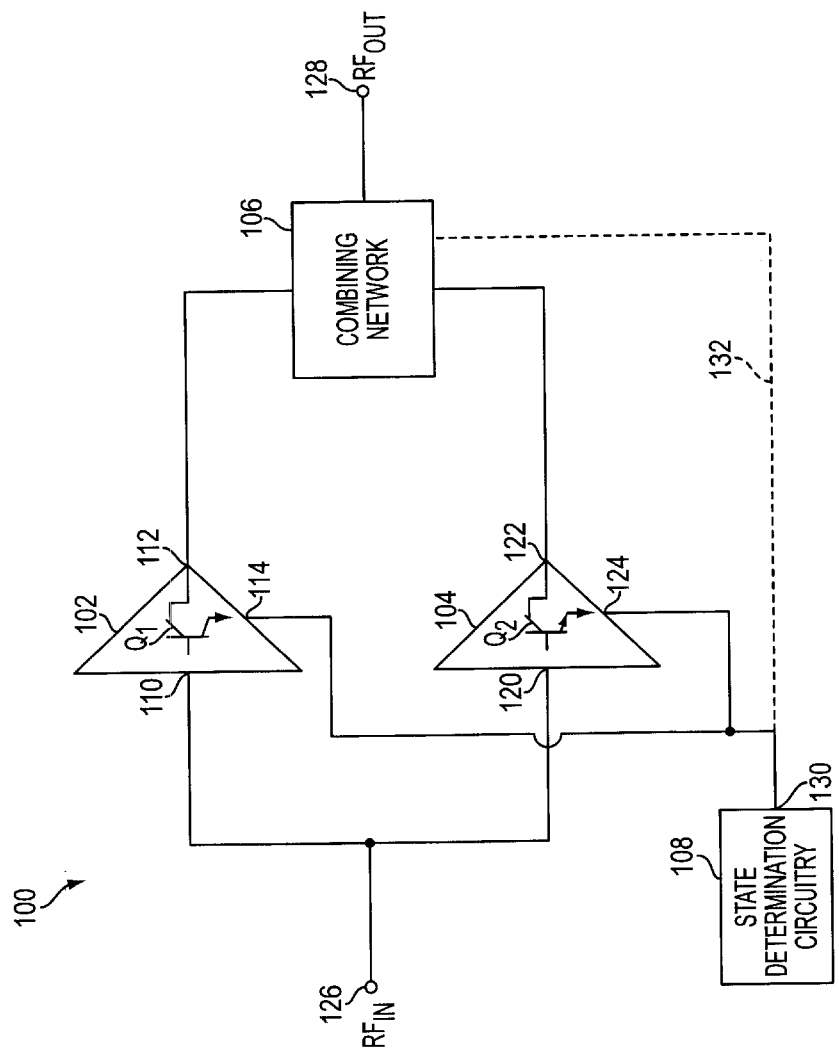
FIG. 1 illustrates a schematic of a switchable path power amplifier in accordance with one embodiment of the present invention.

FIG. 1 illustrates a switchable path power amplifier 100 in accordance with a first embodiment of the present invention. The switchable path power amplifier 100 is well suited for applications such as cellular phones, cordless phones, two way pagers, wireless LANs, and AM and FM analog transmitters. As will be appreciated, depending upon the complexity and/or cost of the system, the power amplifier 100 may serve simply as a driver amplifier, or may be the complete power amplifier for the system.

The switchable path power amplifier 100 includes first and second power devices 102 and 104, a combining network device 106, and state determination circuitry 108. In brief, the two power devices 102 and 104, are designed for power efficient operation at two different output power levels. The combining network 106 and the state determination circuitry work together to switch the output path between the two power devices according to the output power level, thereby achieving power efficiency and acceptable linearity across a broad range of operating states of the power amplifier.

The first power device 102 has a signal input and output 110 and 112, and an enable input 114. Likewise, the second power device 104 has a signal input and output 120 and 122, and an enable input 124. A power amplifier input 126 is coupled to both the first and second power device signal inputs 110 and 120. The first and second power device signal outputs 112 and 122 are both coupled to inputs of the combining network device 106.

The first and second power devices operate such that when enabled, an electrical signal applied at the signal input is amplified at the output. In certain embodiments, the first power device 102 is engineered for high power levels and may be described as a high power amplifier (HPA). The second power device 104 is designed for low power levels and may be described as a low power amplifier (LPA). Both the first and second power devices 102 and 104 provide the maximum voltage swing acceptable for linearity at their respective power levels. The first power device 102 is substantially optimized for power efficiency at the highest output power required of the power amplifier 100. The second power device 104 is substantially optimized for power efficiency at the most used output power level of the power amplifier 100.

The actual implementation of the power devices 102 and 104 varies based upon the goals of the specific application, constraints placed upon the designer, etc. In preferred embodiments, each power device includes a power transistor such as npn transistors Q1 and Q2. Each power device will further typically include DC bias circuitry that holds the power transistor in an initial state such that, under "normal" operating conditions, the input signal controls the output of the power transistor. The design and construction of power amplifiers, including generating power devices having power efficiency optimized for certain power levels, is well known to those of skill in the art of electronics.

The state determination circuitry 108 is operable to selectively enable and disable the first and second power devices 102 and 104. In the embodiment of FIG. 1, the state determination circuitry has a single digital output 130 coupled to the enable input 114 and 124 of the first and second power devices. In this case, the enable logic for the first and second power devices 102 and 104 are opposite of one another. Alternatively, the state determination circuitry 108 can be designed with two control outputs coupled separately to the first and second power devices 102 and 104.

The state determination circuitry 108 may include a digital signal processor, a microcontroller, a power level sensor, programmable logic such as PLD or PAL, and/or other suitable circuitry. For example, when the power amplifier 100 is part of a CDMA cellular telephone system, a microcontroller typically operates the system, controlling, among other things, the output power level. Alternatively, the state determination circuitry 108 may be a power level sensor coupled to the power amplifier output 128, directly measuring the output power level. In certain embodiments, the state determination circuitry 108 includes both a digital processor and power level sensor circuitry, and the state determination decision is based upon the direct measurement of the output power level and other information available to the digital processor.

The combining network device 106 is coupled to the signal outputs 112 and 122 of the first and second power devices, as well as being coupled to the power amplifier output 128. Additionally, as shown by hashed line 132, the combining network device 106 may be coupled to the state determination circuitry 108. The combining network device 106 serves to couple the enabled power device with the power amplifier output 128. The combining network device 106 further serves to decouple the disabled power device from the power amplifier output 128, thereby rendering negligible the effect of the disabled power device upon the amplified output signal. In addition, the combining network device transforms the power amplifier output impedance into the output impedance required for the proper operation of the enabled power device. Each power device is connected to the power amplifier output through a matching network device, which transforms the output impedance at the power amplifier output into the proper output impedance for the operation of the power device. The combining network device may also be used to pass the transformed output impedance of the first matching network device through a switch and the second matching network device to ensure the second power device sees the correct output impedance at the power amplifier output for proper operation.

The combining network device 106 could be implemented by a multiplicity of different circuits including a mechanical relay, a single-pole, double-throw (SPDT) switch, a field effect transistor (FET) switch, a diode switch or a combination of inductor, capacitor, and transmission line components. Several suitable embodiments will be described below with reference to FIGS. 1, 4 and 6.

Figure 2:
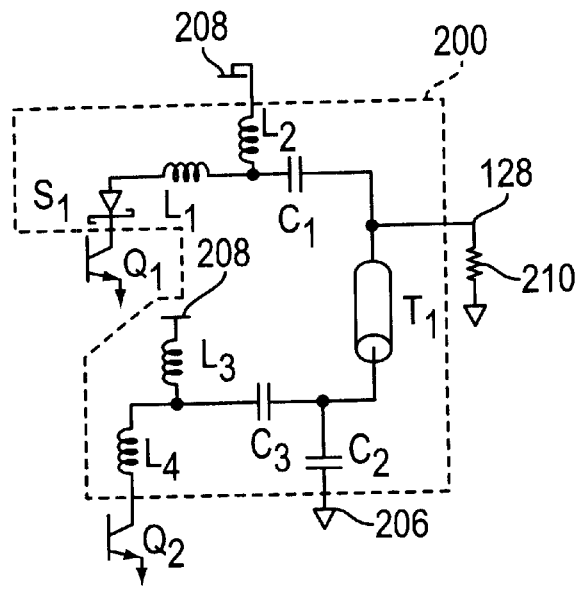
FIG. 2 illustrates a schematic of a combining network device suitable for use in the switchable path power amplifier of FIG. 1, the combining network device in accordance with another embodiment of the present invention.

FIG. 2 illustrates a combining network device 200 in accordance with one embodiment of the present invention. The combining network device 200 includes a first, second, third and fourth inductor L1, L2, L3 and L4, a first, second and third capacitor C1, C2 and C3, a diode such as schottky diode S1, and a transmission line T1. Also shown in FIG. 2 are the power device transistors Q1 and Q2, the power amplifier output 128, and an output load 210.

The combining network device includes an inductor L1 having first and second terminals, a capacitor C1 having first and second terminals, an inductor L2 having first and second terminals, a transmission line having first and second terminals, a capacitor C2 having first and second terminals, a capacitor C3 having first and second terminals, an inductor L3 having first and second terminals, and an inductor L4 having first and second terminals.

The inductor L1 first terminal is electrically coupled to the first power device Q1 collector via the schottky diode S1. The schottky diode S1 acts as an electrical coupling between inductor L1 first terminal and the transistor Q1 collector. The anode of the schottky diode S1 is electrically coupled to the inductor L1 first terminal and the cathode of the schottky diode S1 electrically coupled to the transistor Q1 collector. The inductor L2 first terminal is electrically coupled to a common voltage reference 208, and the inductor L2 second terminal, the inductor L1 second terminal, and the capacitor C1 first terminal are electrically coupled together. The transmission line T1 first terminal, the capacitor C1 second terminal, and the power amplifier output 128 are electrically coupled together. The capacitor C2 second terminal is electrically coupled to the common ground reference 206. The capacitor C3 first terminal, the capacitor C2 first terminal, and the transmission line T1 second terminal are electrically coupled together. The inductor L3 first terminal is electrically coupled to the common voltage reference 208. The inductor L4 first terminal is electrically coupled to the second power device Q2 collector. The inductor L4 second terminal, the inductor L3 second terminal, and the capacitor C3 second terminal are electrically coupled together.

When the power device 104 (i.e., Q2) is enabled, no current flows through the schottky diode S1 and it presents a high impedance to the power amplifier output 128. Accordingly, most of the power generated by the enabled power device 104 is delivered to the output load 210. Assuming the output load 210 has a nominal impedance of 50 Ohms, the transmission line T1 should be selected as a 50 Ohm transmission line, $\lambda/4$ in length. Since the output load 210 is 50 Ohms, the transmission line T1 does not change the impedance seen by the power device 104. When the power device 102 (i.e., Q1) is enabled, the transmission line T1 acts like an open circuit because of the low output impedance of the path to the power device 104. (As will be appreciated, a $\lambda/4$ transmission line terminated in a short circuit presents an infinite impedance to the side opposite the short circuit termination.)

In the embodiment of FIG. 2, the components L1, L2, L3, L4 and C1, C2 and C3 are selected such that the 50 Ohm output load 210 is seen as the desired impedance. For example, it has been found that when the schottky diode S1 has about 1200 micro meter$^2$ of junction area, the inductor L1 is about 1 nano-Henry, the inductor L2 is about 22 nano-Henry, the inductor L3 is about 22 nano-Henry, the inductor L4 is about 1 nano-Henry, the capacitor C1 is about 1.6 pico-Farad, the capacitor C2 is about 4.2 pico-Farad, and the capacitor C3 is about 11 pico-Farad, the network device 200 works as desired. As will be appreciated, these component values are simply an example suitable for the power levels of a CDMA cellular system, providing a corresponding power efficiency. Those of skill in the art will well understand how to select component values necessary for other applications.

Figure 3:
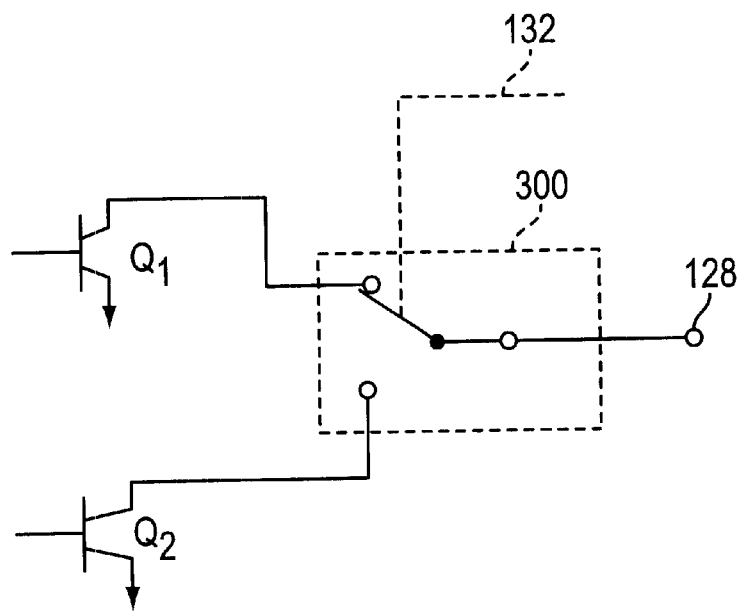
FIG. 3 illustrates a schematic of another combining network device suitable for use in the switchable path power amplifier of FIG. 1, the combining network device in accordance with another embodiment of the present invention.

FIG. 3 illustrates a network device 300 in accordance with another embodiment of the present invention. The network device 300 represents schematically any of the variety of switches, mechanical and electrical, that can be used to switch the path connecting the power amplifier input 126 to the power amplifier output 128. Suitable switches include mechanical relays, single-pole, double-throw switches, transistor and diode switches. As indicated by the connection 132, in the embodiments of FIG. 3, the state determination circuitry 108 not only controls the power devices 102 and 104, the state determination circuitry 108 activates the switch of the network device 300.

Figure 4:
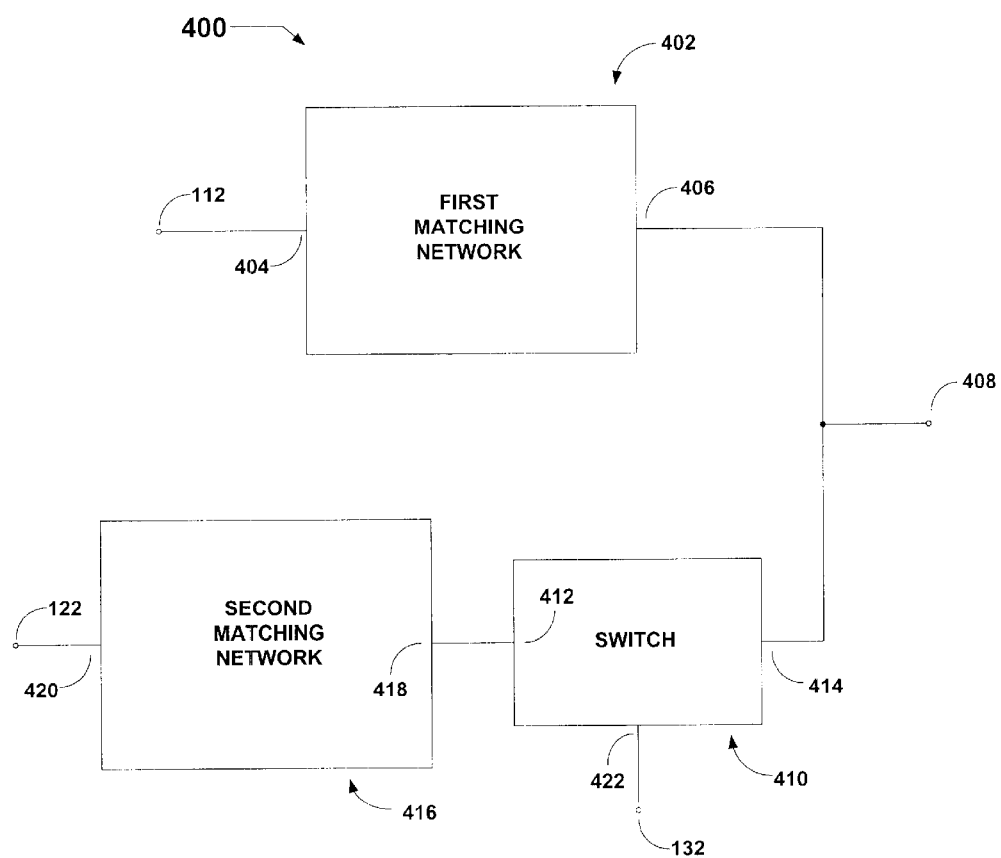
FIG. 4 illustrates an embodiment of another combining network device suitable for use in the switchable path power amplifier of FIG. 1.

FIG. 4 illustrates a combining network device 400 in accordance with another embodiment of the present invention. The combining network device 400 includes first and second matching network devices 402 and 416, and a switch 410, that together allow first and second power devices, the outputs of which are shown at 112 and 122, to share a common output port at 408. The first matching network device 402 has input and output terminals 404 and 406. The input terminal 404 of the first matching network device 402 is electrically coupled to the first power device output 112. The output terminal 406 of the first matching network device 402 is electrically coupled to the power amplifier output at 408. The second matching network device 416 has input and output terminals 420 and 418. The input terminal 420 of the second matching network device 416 is electrically coupled to the second power device output 122. The output terminal 418 of the second matching network device 416 is electrically coupled to the switch 410. The switch 410 has input and output terminals 412 and 414, and a state determination coupling 422. The input terminal 412 of the switch 410 is electrically coupled to the second matching network device 416. The output terminal 414 of the switch 410 is electrically coupled to the power amplifier output at 408. The state determination coupling 422 is electrically coupled to the state determination output 132.

The matching network devices of FIG. 4 serve to transform the output impedance of the power amplifier output at 408 into the output impedance required for proper operation of the enabled power device. The first matching network device at 402 transforms the output impedance of the power amplifier output at 408 into the output impedance required for proper operation of the enabled first power device, the output of which 112, is electrically coupled to the input terminal 404 of the first matching network device at 402. The second matching network device at 416 transforms the output impedance of the power amplifier output at 408 into the output impedance required for proper operation of the enabled second power device, the output of which 122, is electrically coupled to the input terminal 420 of the second matching network device 416. The switch 410 represents a P.i.n. diode that allows for switching between the two matching network devices.

The proper signal from the state determination circuit must be applied to 422 in order to facilitate the switching operation. As in FIG. 1, the state determination circuitry outputs 130 and 132 are used to enable the proper power device, disable the remaining power devices and control the switching between devices within the combining network device. The state determination circuitry is operable to a) enable the first power device and disable the second power device when the switchable path power amplifier is operating at the first output power level and b) enable the second power device and disable the first power device when the switchable path power amplifier is operating at the second output power level. The state determination circuitry may be a power level sensor coupled to the power amplifier output directly measuring the output power level. In certain embodiments, the state determination circuitry includes both a digital processor and power level sensor circuitry, and the state determination decision is based upon the direct measurement of the output power level and other information available to the digital processor.

The enabled power device must operate efficiently and within linearity requirements for the device. Typically, the power device is adjusted to achieve peak efficiency at a single output power level and supply voltage. Peak efficiency requires that the voltage swing at the output be as large as possible, however this has a detrimental effect on linearity. Therefore, the inductive coupling of power devices, such as amplifiers, is an effective method to improve efficiency and maintain linearity. Each matching network is an LC (inductor-capacitor) circuit with component values selected to achieve the proper impedance for each power device. With an inductance placed in the collector circuit rather than a resistance, the maximum swing in collector current is also the maximum swing in load current. If conversion efficiency is the ratio of AC load power to the power delivered by the source, inductive coupling results in excellent efficiency due to low power dissipation in the bias circuit. If there is a plurality of power devices adjusted to operate at different output power levels, then the use of separate, switchable, inductive coupling circuits is ideal. Component values may be calculated, which are suitable for the power levels of a CDMA cellular system, providing corresponding power efficiency. However, those of skill in the art will well understand how to select component values necessary for other applications.

Figure 5:
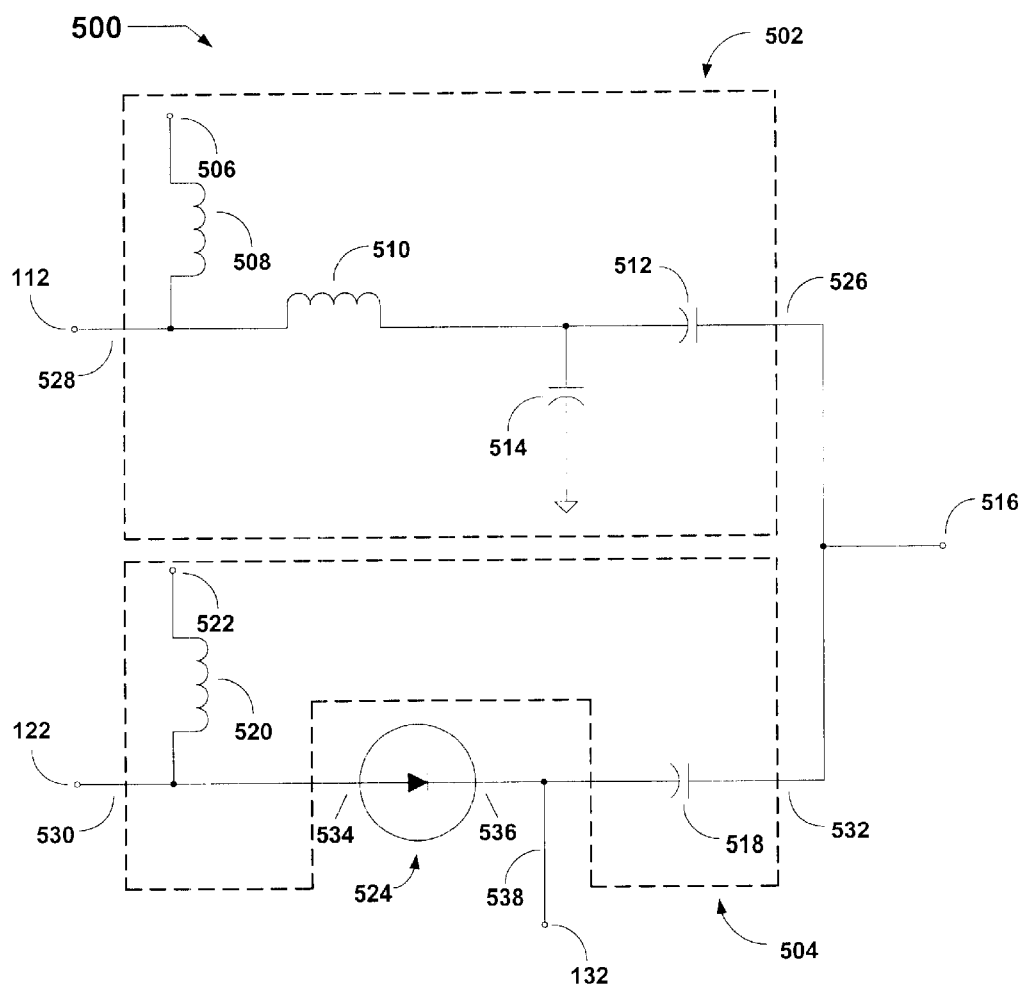
FIG. 5 illustrates a schematic of the combining network device in FIG. 4, the combining network device in accordance with another embodiment of the present invention.

FIG. 5 illustrates a specific implementation of the combining network device described in FIG. 4. Circuit 500 in FIG. 5 includes first and second matching network devices 502 and 504, a switch 524 and a state determination coupling 538. The first matching network device 502 includes first and second inductors 508 and 510, first and second capacitors 514 and 512, and input and output terminals 528 and 526. The input terminal 528 of the first matching network device 502 is electrically coupled to the output of the first power device at 112. The first inductor 508 of the first matching network device 502 has first and second terminals, the first terminal is electrically coupled to supply voltage 506. The second terminal of inductor 508 is electrically coupled to the first matching network device input terminal 528. The second inductor 510 of the first matching network device 502 has first and second terminals, the first terminal electrically coupled to the first matching network device input terminal 528. The second terminal of inductor 510 is electrically coupled to the second capacitor 512. The first capacitor 514 of the first matching network device 502 has first and second terminals, the first terminal electrically coupled to ground. The second terminal of the first capacitor 514 is electrically coupled to the coupling of the second inductor 510 and the second capacitor 512. The second capacitor 512 of the first matching network device 502 has first and second terminals, the first terminal electrically coupled to the second inductor 510. The second terminal of the second capacitor 512 is electrically coupled to the first matching network device output terminal 526. The output terminal 526 of the first matching network device 502 is electrically coupled to the power amplifier output at 516.

Circuit 500 in FIG. 5 also includes a second matching network device 504 which includes a third inductor 520, a third capacitor 518, and input and output terminals 530 and 532. The input terminal 530 of the second matching network device 504 is electrically coupled to the output of the second power device at 122. The third inductor 520 of the second matching network device 504 has first and second terminals, the first terminal electrically coupled to supply voltage at 522. The second terminal is electrically coupled to the second matching network device 504 input terminal 530. The third capacitor 518 of the second matching network device 504 has first and second terminals, the first terminal electrically coupled to the switch 524. The second terminal of the third capacitor 518 is electrically coupled to the second matching network device 504 output terminal 532. The output terminal 532 of the second matching network device 504 is electrically coupled to the power amplifier output at 516.

Circuit 500 in FIG. 5 also includes a switch 524, which has an anode and cathode 534 and 536, the anode 534 electrically coupled to the second matching network device 504 input terminal 530. The cathode 536 is electrically coupled to the third capacitor 518. The coupling of the cathode 536 and the third capacitor 518 is electrically coupled to 132 via the state determination coupling 538.

Figure 6:
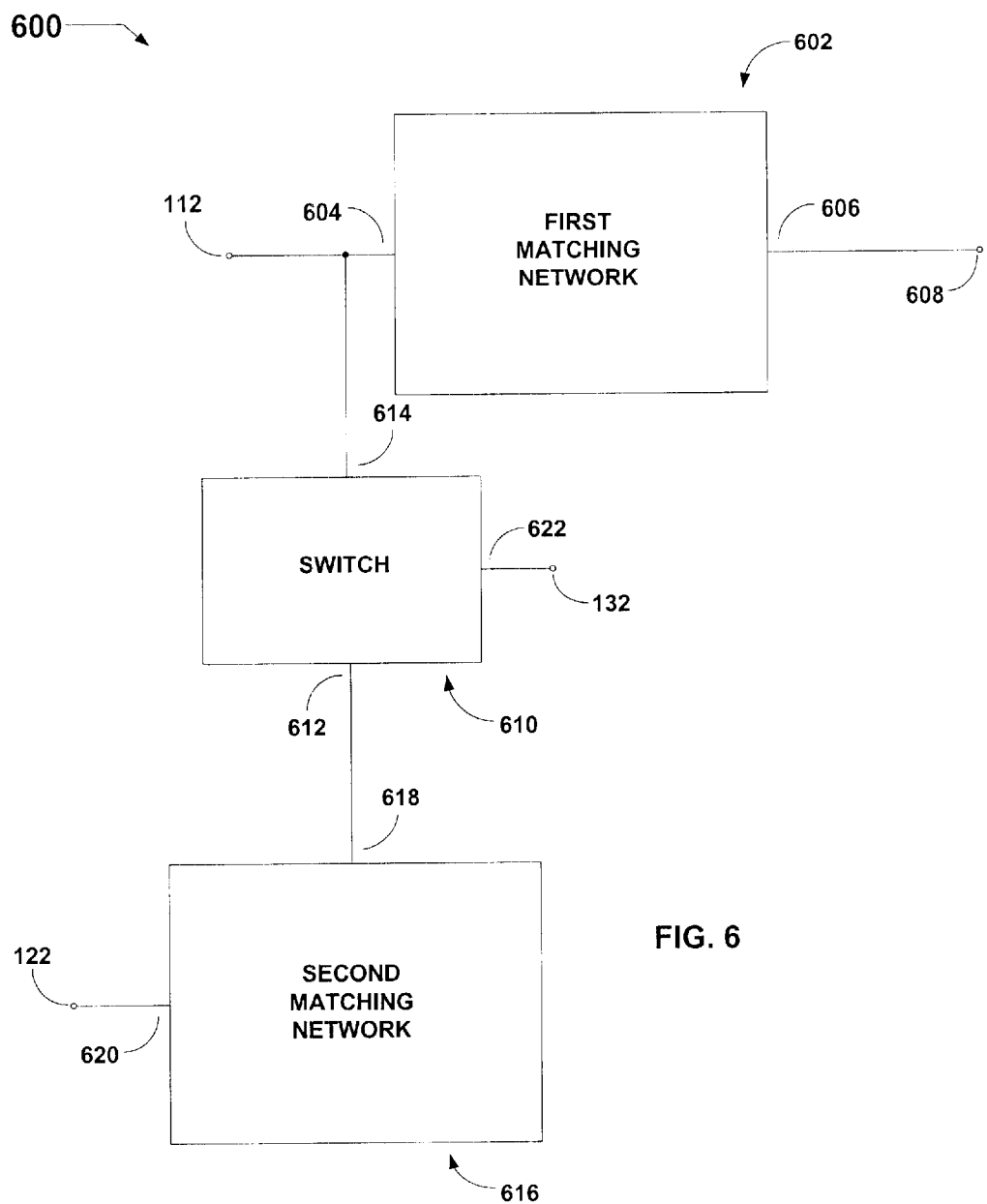
FIG. 6 illustrates another embodiment of another combining network device suitable for use in the switchable path power amplifier of FIG. 1.

FIG. 6 illustrates a combining network device 600 in accordance with another embodiment of the present invention. The combining network device 600 includes first and second matching network devices 602 and 616, and a switch 610, that together allow the first and second power devices, the outputs of which are shown at 112 and 122, to share a common output port at 608. The first matching network device 602 has input and output terminals 604 and 606. The input terminal 604 of the first matching network device 602 is electrically coupled to the first power device output 112. The output terminal 606 of the first matching network device 602 is electrically coupled to the power amplifier output at 608. The second matching network device 616 has input and output terminals 620 and 618. The input terminal 620 is electrically coupled to the second power device output 122. The output terminal 618 of the second matching network device 616 is electrically coupled to the switch 61 0. The switch 610 has input and output terminals 612 and 614, and a state determination coupling 622. The input terminal 612 of the switch 610 is electrically coupled to the second matching network device 616. The output terminal 614 of the switch 610 is electrically coupled to the first power device output 112. The state determination coupling 622 is electrically coupled to the state determination output 132.

The matching network devices of FIG. 6 serve to transform the output impedance of the power amplifier output at 608 into the output impedance required for the proper operation of the enabled power device. The first matching network device at 602 transforms the output impedance of the power amplifier output at 608 into the output impedance required for the proper operation of the enabled first power device, the output of which 112, is electrically coupled to the input terminal 604 of the first matching network device 602. The second matching network device at 616 transforms the output impedance of the power amplifier output at 608 into the output impedance required for the proper operation of the enabled second power device, the output of which 122, is electrically coupled to the input terminal 620 of the second matching network device 616. The switch 610 represents a P.i.n. diode that allows for switching between the two matching network devices.

The proper signal from the state determination circuit must be applied to 622 in order to facilitate the switching operation. As in FIG. 1, the state determination circuitry outputs 130 and 132 are used to enable the proper power device, disable the remaining power devices and control the switching between devices within the combining network device. The state determination circuitry is operable to a) enable the first power device and disable the second power device when the switchable path power amplifier is operating at the first output power level and b) enable the second power device and disable the first power device when the switchable path power amplifier is operating at the second output power level. The state determination circuitry may be a power level sensor coupled to the power amplifier output directly measuring the output power level. In certain embodiments, the state determination circuitry includes both a digital processor and power level sensor circuitry, and the state determination decision is based upon the direct measurement of the output power level and other information available to the digital processor.

The combining network device 600 further protects performance by considering the impact a high power amplifier (HPA), used as the first power device, may have on overall implementation, when in use with a low power amplifier (LPA) as the second power device. The parallel connection of matching network devices is modified, thereby reducing the effect of the HPA on LPA performance. The second matching network device 616, switch 610 and first matching network device are placed in series. The output of the first power device, in this case a HPA, is electrically coupled to the coupling of the first matching network device 616 input 604 and switch 610. The output of the second power device, in this case a LPA, is electrically coupled to the second matching network device 616 input 620. In device 600, the first matching network device transforms the output impedance into an output impedance preferred by the HPA which is then passed through both a switch and the second matching network device to ensure the LPA sees the correct output impedance at the power amplifier output for proper operation. In this embodiment, the overall efficiency is thereby improved due to the reduced effect of the first power device, HPA, on the overall implementation.

Figure 7A:
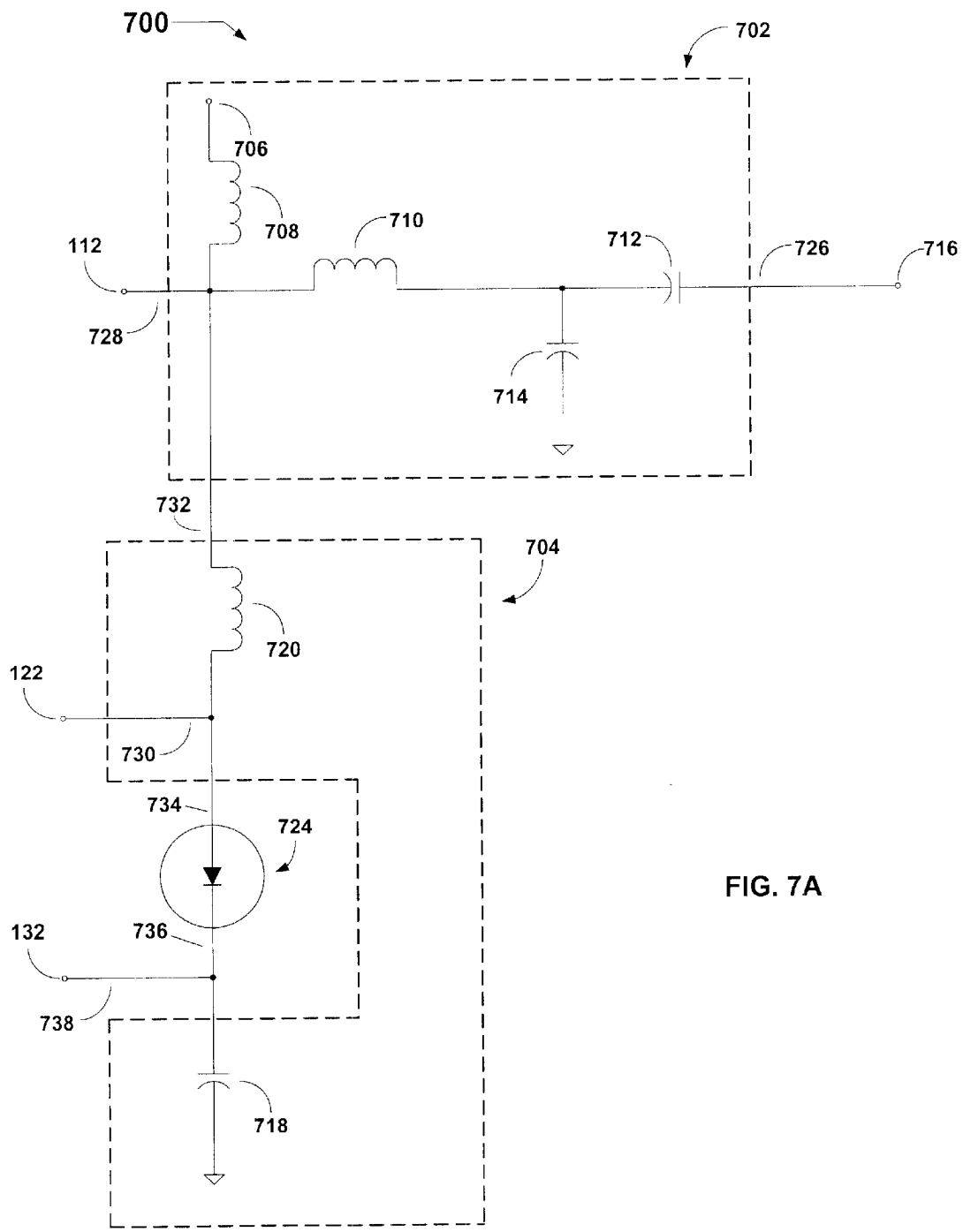
FIG. 7A illustrates a schematic of the combining network device in FIG. 6, the combining network device in accordance with another embodiment of the present invention.

FIG. 7A illustrates a specific implementation of the combining network device described in FIG. 6. Circuit 700 in FIG. 7A includes first and second matching network devices 702 and 704, a switch 724 and a state determination coupling 738. The first matching network device 702 includes first and second inductors 708 and 710, first and second capacitors 714 and 712, and input and output terminals 728 and 726. The input terminal 728 of the first matching network device 702 is electrically coupled to the output of the first power device at 112. The first inductor 708 of the first matching network device 702 has first and second terminals, the first terminal electrically coupled to supply voltage 706. The second terminal of inductor 708 is electrically coupled to the first matching network device input terminal 728. The second inductor 710 of the first matching network device 702 has first and second terminals, the first terminal electrically coupled to the first matching network device input terminal 728. The second terminal of inductor 710 is electrically coupled to the second capacitor 712. The first capacitor 714 of the first matching network device 702 has first and second terminals, the first terminal electrically coupled to ground. The second terminal of the first capacitor 714 is electrically coupled to the coupling of the second inductor 710 and the second capacitor 712. The second capacitor 712 of the first matching network device 702 has first and second terminals, the first terminal electrically coupled to the second inductor 710. The second terminal of the second capacitor 712 is electrically coupled to the first matching network device output terminal 726. The output terminal 726 of the first matching network device 702 is electrically coupled to the power amplifier output at 716.

Circuit 700 in FIG. 7A also includes a second matching network device 704 which includes a third inductor 720, a third capacitor 718, and input and output terminals 730 and 732. The input terminal 730 of the second matching network device 704 is electrically coupled to the output of the second power device at 122. The third inductor 720 of the second matching network device 704 has first and second terminals, the first terminal electrically coupled to the second matching network device output terminal 732. The output terminal 732 of the second matching network device 704 is electrically coupled to the first matching network device 702 input terminal 728. The second terminal of the third inductor 720 is electrically coupled to the second matching network device 704 input terminal 730. The third capacitor 718 of the second matching network device 704 has first and second terminals, the first terminal electrically coupled to the switch 724. The second terminal of the third capacitor: 718 is electrically coupled to ground.

Circuit 700 in FIG. 7A also includes a switch 724 which has anode and cathode 734 and 736, the anode 734 electrically coupled to the second matching network device input terminal 730. The cathode 736 is electrically coupled to the third capacitor 718. The coupling of the cathode 736 and the third capacitor 718 is electrically coupled to 132 via the state determination coupling 738.

Figure 7B:
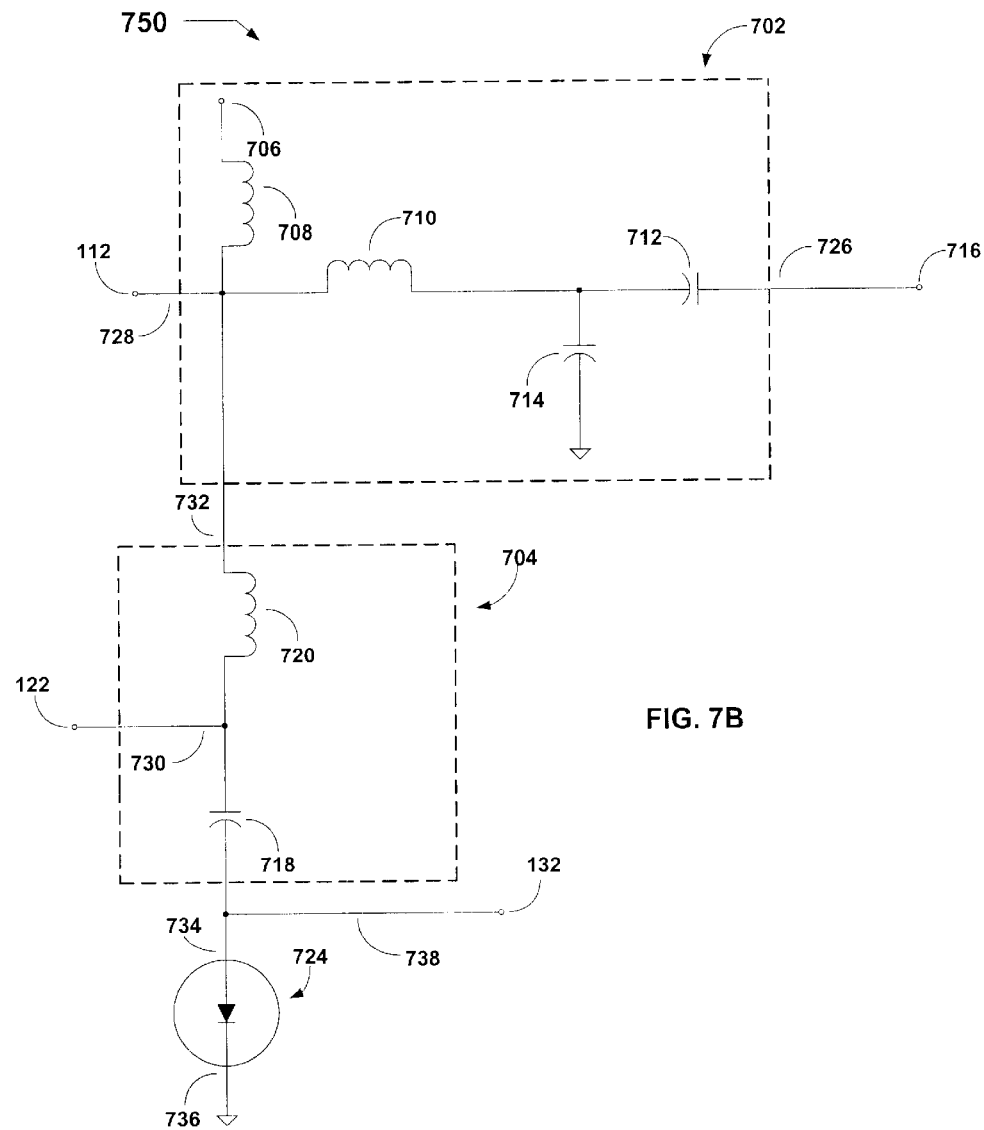
FIG. 7B illustrates another schematic of the combining network device in FIG. 6, the combining network device in accordance with another embodiment of the present invention.

Circuit 750 in FIG. 7B represents a slight modification to circuit 700 in FIG. 7A. The positions of the switch 724 and the third capacitor 718 are transposed about the state determination coupling 738. The third capacitor 718 has first and second terminals, but in circuit 750, the first terminal is electrically coupled to the second matching network device input terminal 730. The second terminal of the third capacitor 718 is electrically coupled to switch 724. The switch 724 has anode and cathode 734 and 736, the anode 734 electrically coupled the third capacitor 718. The cathode 736 is electrically coupled to ground. The state determination coupling 738 is electrically coupled to the coupling of the anode 734 and the third capacitor 718.

Figure 8A:
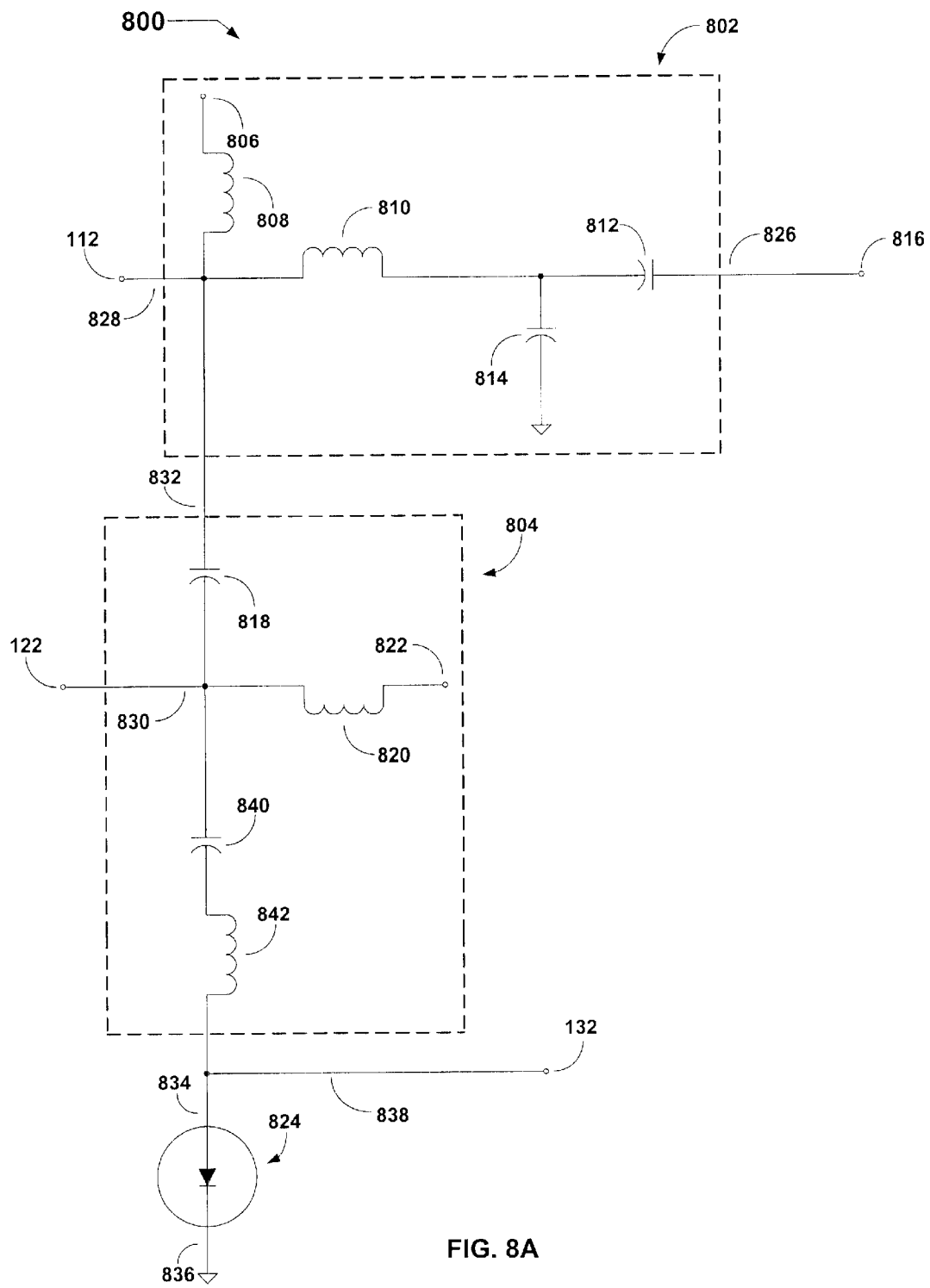
FIG. 8A illustrates another schematic of the combining network device in FIG. 6, the combining network device in accordance with another embodiment of the present invention.

FIG. 8A illustrates another specific implementation of the combining network device described in FIG. 6. Circuit 800 in FIG. 8A includes first and second matching network devices, 802 and 804, a switch 824 and a state determination coupling 838. The first matching network device 802 includes first and second inductors 808 and 810, first and second capacitors 814 and 812, and input and output terminals 828 and 826. The input terminal 828 of the first matching network device 802 is electrically coupled to the output of the first power device at 112. The first inductor 808 of the first matching network device 802 has first and second terminals, the first terminal is electrically coupled to supply voltage 806. The second terminal of inductor 808 is electrically coupled to the first matching network device input terminal 828. The second inductor 810 of the first matching network device 802 has first and second terminals, the first terminal electrically coupled to the first matching network device input terminal 828. The second terminal of inductor 810 is electrically coupled to the second capacitor 812. The first capacitor 814 of the first matching network device 802 has first and second terminals, the first terminal electrically coupled to ground. The second terminal of the first capacitor 814 is electrically coupled to the coupling of the second inductor 810 and the second capacitor 812. The second capacitor 812 of the first matching network device 802 has first and second terminals, the first terminal electrically coupled to the second inductor 810. The second terminal of the second capacitor 812 is electrically coupled to the first matching network device output terminal 826. The output terminal 826 of the first matching network device 802 is electrically coupled to the power amplifier output at 816.

Circuit 800 in FIG. 8A also includes a second matching network device 804, which includes third and fourth inductors 820 and 842, third and fourth capacitors 818 and 840, and input and output terminals 830 and 832. The input terminal 830 of the second matching network device 804 is electrically coupled to the output of the second power device at 122. The third inductor 820 of the second matching network device 804 has first and second terminals, the first terminal electrically coupled to supply voltage 822. The second terminal of the third inductor 820 is electrically coupled to the second matching network device 804 input terminal 830. The third capacitor 818 of the second matching network device 804 has first and second terminals, the first terminal electrically coupled to the second matching network device 804 output terminal 832. The output terminal 832 of the second matching network device 804 is electrically coupled to the first matching network device 802 input terminal 828. The second terminal of the third capacitor 818 is electrically coupled to the second matching network device 804 input terminal 830. The fourth capacitor 840 of the second matching network device 804 has first and second terminals, the first terminal electrically coupled to the second matching network device 804 input terminal 830. The second terminal of the fourth capacitor 840 is electrically coupled to the fourth inductor 842. The fourth inductor 842 has first and second terminals, the first terminal electrically coupled to the fourth capacitor 840. The second terminal of the fourth inductor 842 is electrically coupled to the switch 824.

Circuit 800 in FIG. 8A also includes a switch 824 which has anode and cathode 834 and 836, the anode 834 electrically coupled to the fourth inductor 842. The cathode 836 is electrically coupled to ground. The coupling of the anode 834 and the fourth inductor 842 is electrically coupled to 132 via the state determination coupling 838.

Figure 8B:
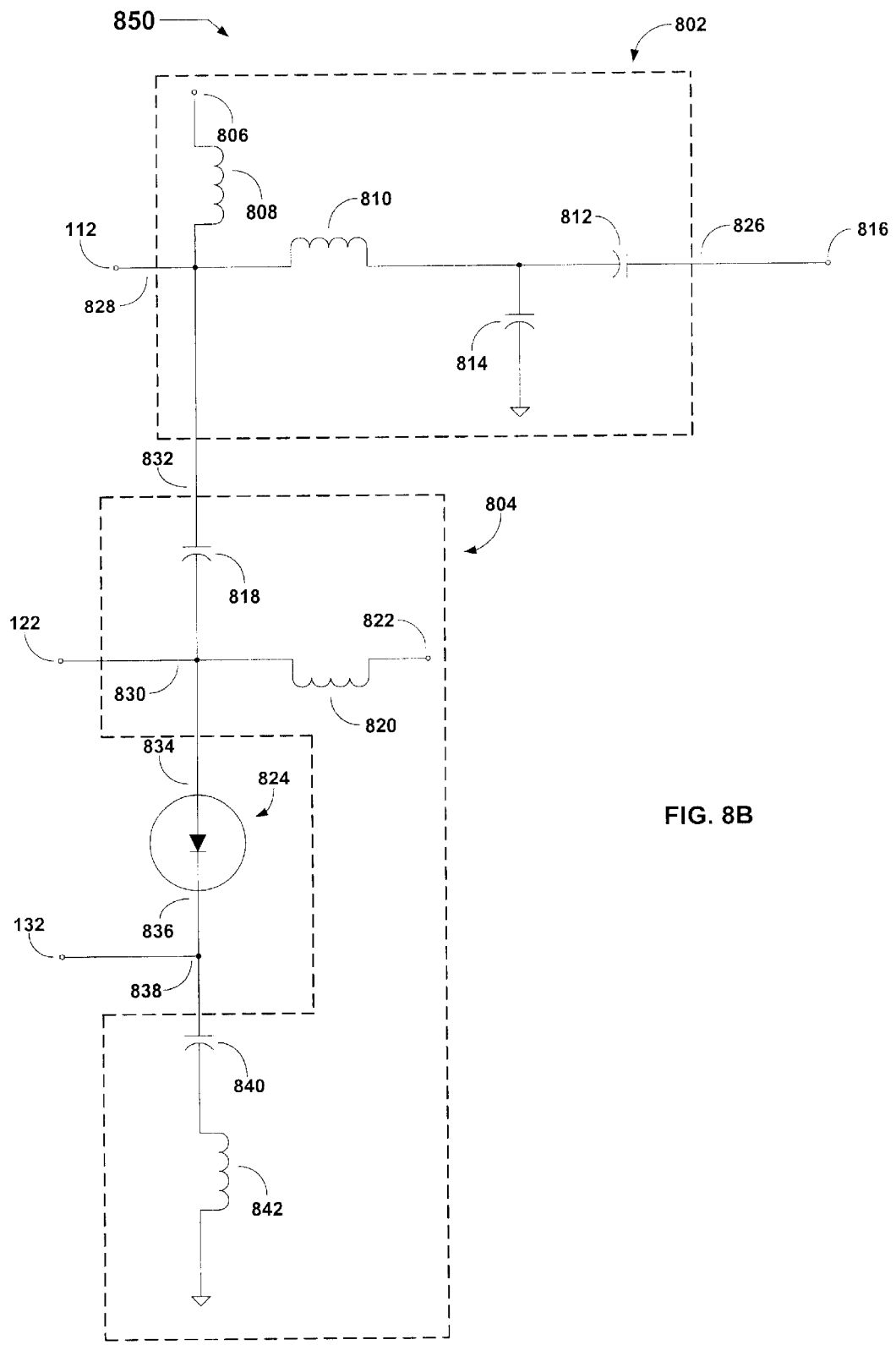
FIG. 8B illustrates another schematic of the combining network device in FIG. 6, the combining network device in accordance with another embodiment of the present invention.

Circuit 850 in FIG. 8B represents a slight modification to circuit 800 in FIG. 8A. The positions of the switch 824 and the coupled fourth capacitor 840 and fourth inductor 842 are transposed about the state determination coupling 838. The fourth capacitor 840 has first and second terminals, but in circuit 800, the first terminal is electrically coupled to the switch 824. The second terminal of the fourth capacitor 840 remains electrically coupled to the fourth inductor 842. The fourth inductor 842 has first and second terminals, the first terminal remains electrically coupled to the fourth capacitor 840. The second terminal of the fourth inductor 842 is electrically coupled to ground. The switch 824, has anode and cathode 834 and 836, the anode 834 electrically coupled the second matching network device 804 input terminal 830. The cathode 836 is electrically coupled to the fourth capacitor 840. The state determination coupling 838 is electrically coupled to the coupling of the cathode 836 and the fourth capacitor 840.

The matching network devices of each combining network device transform the output impedance at the power amplifier output into the output impedance required for the proper operation of the enabled power device. Each matching network is an LC (inductor-capacitor) circuit with component values selected to achieve the proper impedance for each power device. The switch represents a P.i.n. diode (the preferred element of a switch element) that allows for switching between the two matching network devices. Component values may be calculated which are suitable for the power levels of a CDMA cellular system, providing corresponding power efficiency. However, those of skill in the art will well understand how to select component values necessary for other applications.

Although only a few embodiments of the present invention have been described in detail herein, it should be understood that the present invention may be embodied in many other specific forms without departing from the spirit or scope of the invention. For example, the power devices such as first and second power devices 102 and 104 of FIG. 1 may each be either linear or nonlinear devices, or even a combination thereof. Additionally, the power devices may utilize any suitable power amplification technology such as bipolar transistor or field effect transistor (FET) technology.

In preferred embodiments of the power amplifier 100, the first power device 102 and the second power device 104 are formed on a single device. This single device and the combining network device 106 are then formed together within a single integrated circuit package. Alternatively, these components could be packaged separately, and then wired together on some suitable mechanism such as a printed circuit board.

The power amplifier 100 of FIG. 1 illustrates the use of just two power devices. However, it is contemplated that more than two power devices could be utilized. In such a case, each power device would be optimized for power efficiency during a specific- state (e.g., operating power level) of the power amplifier. Correspondingly, the state determination circuitry 108 and the combining network device 106 would operate to select the proper power device, isolating the disabled power devices from the output 128.

Utilization of different power devices designed for power efficient operation at specific power level was described in some detail above. However, the power devices could be designed for power efficient operation corresponding to other operating conditions such as signal waveform (e.g., digital versus analog), ambient temperature, power supply waveform, etc. In these embodiments, the state determination circuitry would enable the best power device available and disable the others. Likewise, it is contemplated that the power devices could be optimized for other purposes, such as linearity in a certain operating range, and then the state determination circuitry would enable the best power device available based on criteria including something other than power efficiency.

Therefore, the present examples and embodiments are to be considered as illustrative and not restrictive, and the invention is not to be limited to the details given herein, but may be modified within the scope of the appended claims.

We claim:

1. A combining network device suitable for use in a switchable path power amplifier including a first combining network device input coupled to a first power device, a second combining network device input coupled to a second power device, and a single combining network device output coupled to a power amplifier output wherein, a. said first power device is a high power amplifier;
   b. said second power device is a low power amplifier;
   c. said combining network device being operable to couple either said first power device or said second power device to said power amplifier output such that only an enabled power device drives said power amplifier output;
   d. said combining network device being operable to decouple a disabled power device from said power amplifier output such that any effect of said disabled power device upon an amplified electrical signal generated by said enabled power device is negligible; and
   d. said combining network device being operable to transform output impedance at said power amplifier output into a proper output impedance required for proper operation of said enabled power device.

2. A combining network device as recited in claim 1 wherein said combining network device includes:
   a. a first matching network device having first and second inductors, and having first and second capacitors;
   b. a second matching network device having a third inductor and capacitor;
   c. a state determination coupling; and
   d. a diode switch.

3. A first matching network device as recited in claim 2 wherein,
   a. said first inductor has first and second terminals, said first terminal electrically coupled to a supply voltage and said second terminal electrically coupled to the output of said first power device;
   b. said second inductor has first and second terminals, said first terminal electrically coupled to said first power device output, and said second terminal electrically coupled to said second capacitor;
   c. said first capacitor has first and second terminals, said first terminal electrically coupled to ground and said second terminal electrically coupled to said coupling of said second inductor and said second capacitor; and
   d. said second capacitor has first and second terminals, said first terminal electrically coupled to said second inductor and said second terminal electrically coupled to said power amplifier output.

4. A second matching network device as recited in claim 2 wherein,
   a. said third inductor has first and second terminals, said first terminal electrically coupled to said supply voltage and said second terminal electrically coupled to the output of said second power device; and
   b. said third capacitor has first and second terminals, said first terminal electrically coupled to said diode switch, and said second terminal electrically coupled said power amplifier output.

5. A state determination coupling as recited in claim 2 wherein, said state determination coupling is electrically coupled to said coupling of said diode switch and said third capacitor.

6. A diode switch as recited in claim 2 wherein, said diode has an anode and cathode, said anode electrically coupled to said second power device output, and said cathode electrically coupled said third capacitor.

7. A diode switch as recited in claim 2 wherein said diode is a Schottky diode.

8. A combining network device suitable for use in a switchable path power amplifier including a first combining network device input coupled to a first power device, a second combining network device input coupled to a second power device, and a single combining network device output coupled to a power amplifier output wherein,
   a. said first power device is a high power amplifier;
   b. said second power device is a low power amplifier;
   c. said combining network device being operable to couple either said first power device or said second power device to said power amplifier output such that only an enabled power device drives said power amplifier output;
   d. said combining network device being operable to decouple a disabled power device from said power amplifier output such that any effect of said disabled power device upon an amplified electrical signal generated by said enabled power device is negligible; and
   e. said combining network device being operable to transform output impedance at said power amplifier output into a proper output impedance required for proper operation of said enabled power device such that said high power amplifier has reduced effect.

9. A combining network device as recited in claim 8 wherein, said combining network device includes:
   a. a first matching network device having first and second inductors, and having first and second capacitors;
   b. a second matching network device having a third inductor and capacitor;
   c. a state determination coupling; and
   d. a diode switch.

10. A first matching network device as recited in claim 9 wherein,
   a. said first inductor has first and second terminals, said first terminal electrically coupled to a supply voltage, and said second terminal electrically coupled to the output of said first power device;
   b. said second inductor has first and second terminals, said first terminal electrically coupled to said first power device output, and said second terminal electrically coupled to said second capacitor;
   c. said first capacitor has first and second terminals, said first terminal electrically coupled to ground and said second terminal electrically coupled to said coupling of said second inductor and said second capacitor; and
   d. said second capacitor has first and second terminals, said first terminal electrically coupled to said second inductor, and said second terminal electrically coupled to said power amplifier output.

11. A second matching network device as recited in claim 9 wherein,
   a. said third inductor has first and second terminals, said first terminal electrically coupled to said first power device output, and said second terminal electrically coupled to the output of said second power device; and
   b. said third capacitor has first and second terminals, said first terminal electrically coupled to said diode switch, and said second terminal electrically coupled to ground.

12. A state determination coupling as recited in claim 9 wherein said state determination coupling is electrically coupled to said coupling of said diode switch and said third capacitor.

13. A diode switch as recited in claim 9 wherein said diode switch has an anode and cathode, said anode electrically coupled to said second power device output, and said cathode electrically coupled to said third capacitor.

14. A diode switch as recited in claim 9 wherein said diode is a Schottky diode.

15. A second matching network device as recited in claim 9 wherein,
   a. said third inductor has first and second terminals, said first terminal electrically coupled to said first power device output, and said second terminal electrically coupled to output of said second power device; and
   b. said third capacitor has first and second terminals, said first terminal electrically coupled to said second power device output, and said second terminal electrically coupled to said diode switch.

16. A state determination coupling as recited in claim 9 wherein, said state determination coupling is electrically coupled to said coupling of said diode switch and said third capacitor.

17. A diode switch as recited in claim 9 wherein, said diode switch has an anode and cathode, said anode electrically coupled to said third capacitor, and said cathode electrically coupled to ground.

18. A diode switch as recited in claim 9 wherein said diode is a Schottky diode.

19. A combining network device as recited in claim 8 wherein said combining network device includes;
   a. a first matching network device having first and second inductors, and having first and second capacitors;
   b. a second matching network device having third and fourth inductors, and having third and fourth capacitors.
   c. a state determination coupling; and
   d. a diode switch.

20. A first matching network device as recited in claim 19 wherein,
   a. said first inductor has first and second terminals, said first terminal electrically coupled to a supply voltage, and said second terminal electrically coupled to the output of said first power device;
   b. said second inductor has first and second terminals, said first terminal electrically coupled to said first power device output, and said second terminal electrically coupled to said second capacitor;
   c. said first capacitor has first and second terminals, said first terminal electrically coupled to ground, and said second terminal electrically coupled to said coupling of said second inductor and second capacitor; and
   d. said second capacitor has first and second terminals, said first terminal electrically coupled to said second inductor, and said second terminal electrically coupled to said power amplifier output.

21. A second matching network device as recited in claim 19 wherein,
   a. said third inductor has first and second terminals, said first terminal electrically coupled to said supply voltage, and said second terminal electrically coupled to the output of said second power device,
   b. said fourth inductor has first and second terminals, said first terminal electrically coupled to said fourth capacitor, and said second terminal electrically coupled to said diode switch;
   c. said third capacitor has first and second terminals, said first terminal electrically coupled said first power device output, and said second terminal electrically coupled to said second power device output; and
   d. said fourth capacitor has first and second terminals, said first terminal electrically coupled to said second power device output, and said second terminal electrically coupled to said fourth inductor.

22. A state determination coupling as recited in claim 19 wherein said state determination coupling is electrically coupled to said coupling of said fourth inductor and said diode switch.

23. A diode switch as recited in claim 19 wherein said diode switch has an anode and cathode, said anode electrically coupled to said fourth inductor, and said cathode electrically coupled to ground.

24. A diode switch as recited in claim 19 wherein said diode is a Schottky diode.

25. A second matching network device as recited in claim 19 wherein, a. said third inductor has first and second terminals, said first terminal electrically coupled to said supply voltage, and said second terminal electrically coupled to said second power device output;

b. said fourth inductor has first and second terminals, said first terminal electrically coupled to said fourth capacitor, and said second terminal electrically coupled to ground;

c. said third capacitor has first and second terminals, said first terminal electrically coupled said first power device output, and said second terminal electrically coupled to said second power device output; and d. said fourth capacitor has first and second terminals, said first terminal electrically coupled to said diode switch, and said second terminal electrically coupled to said fourth inductor.

26. A state determination coupling as recited in claim 19 wherein said state determination coupling is electrically coupled to said coupling of said fourth capacitor and said diode switch.

27. A diode switch as recited in claim 19 wherein said diode switch has an anode and cathode, said anode electrically coupled to said second power device output, and said cathode electrically coupled to said fourth capacitor.

28. A diode switch as recited in claim 19 wherein said diode is a Schottky diode.

* * * * *